United States Patent [19]

Powell

[11] Patent Number: 4,621,226
[45] Date of Patent: Nov. 4, 1986

[54] APPARATUS AND METHOD FOR DETERMINING AN INPUT ELECTRICAL CHARACTERISTIC OF A DEVICE UNDER TEST

[75] Inventor: Robert C. Powell, Gaithersburg, Md.

[73] Assignee: Weinschel Engineering Co., Inc., Gaithersburg, Md.

[21] Appl. No.: 613,340

[22] Filed: May 23, 1984

[51] Int. Cl.[4] .................. G01R 27/06; G01R 27/04
[52] U.S. Cl. ........................... 324/58 B; 324/58 R; 324/57 R; 324/DIG. 1
[58] Field of Search ............ 324/DIG. 1, 57 R, 58 R, 324/58 A, 58 B, 58 C, 74, 95, 84

[56] References Cited

U.S. PATENT DOCUMENTS

| | | |
|---|---|---|
| 3,054,948 | 10/1962 | Rymaszewski . |
| 3,423,675 | 1/1969 | Kraus .................... 324/58 B |
| 3,693,078 | 9/1972 | Sorger ................... 324/58 B |
| 3,763,431 | 3/1964 | Hopfer . |
| 4,104,583 | 8/1978 | Engen .................... 324/58 R |
| 4,359,682 | 11/1982 | Winslow ................ 324/58 B |
| 4,427,936 | 1/1984 | Riblet .................... 324/58 B |
| 4,489,271 | 12/1984 | Riblet .................... 324/58 B |
| 4,521,728 | 6/1985 | Li ......................... 324/58 R |

FOREIGN PATENT DOCUMENTS 970830 12/1972 Canada .

Primary Examiner—Reinhard J. Eisenzopf
Assistant Examiner—Jose M. Solis
Attorney, Agent, or Firm—Hall, Myers & Rose

[57] ABSTRACT

Apparatus and method for determining an input electrical characteristic of a device under test by power-related measurements made by the device under test, wherein the input characteristic to be determined is related to the input impedance of the device under test. Specifically, the input impedance, the reflection coefficient, or the standing wave ratio of the input to the device under test is determined by a plurality of power, voltage, or current measurements made by a meter or sensor in the device under test. The plurality of measurements are made when the device under test is in a network including (a) a first leg having a first fixed impedance and a selectively variable impedance forming a series and (b) a second leg having a second fixed impedance and the device under test in series, an electrical input of constant amplitude being applied to the network with power being split symmetrically between the two legs. Three measurements made by the device under test when the variable impedance is selected to be in open circuit, a short circuit, and an impedance matched to the second fixed impedance are combined to provide the value of the sought input characteristic.

26 Claims, 7 Drawing Figures

APPARATUS AND METHOD FOR DETERMINING AN INPUT ELECTRICAL CHARACTERISTIC OF A DEVICE UNDER TEST

FIELD OF THE INVENTION

The present invention relates to determining an electrical input characteristic, such as input impedance, of a device under test.

BACKGROUND OF THE INVENTION

When analyzing the transmission of electrical (including electromagnetic) power to a device or network, it is often necessary or desirable that the impedance of the device or network be known. In addition to the input impedance, however, various other input characteristics which also indicate how the device or network responds to the application of power thereto may be sought as well. Such other input characteristics are normally related to impedance in some way.

The reflection coefficient for a device under test provides a vector ratio between power reflected from the device under test and power incident upon the device under test. The more specific voltage reflection coefficient represents the vector ratio between the electric field reflected from the device under test relative to the electric field of the incident wave thereto. Both of these reflection coefficients related to a device under test are functions of impedance. For example, where a source of impedance $Z_I$ provides power along a uniform line to the device under test which has an impedance $Z_{II}$, the voltage reflection coefficient is defined by the expression:

$$(Z_{II}-Z_I)/(Z_{II}+Z_I).$$

The standing wave ratio (SWR) is, in turn, a function of the reflection coefficient. That is, if a device under test has a reflection coefficient p, the SWR of a uniform transmission line is defined by the expression:

$$(1+p)/(1-p).$$

Accordingly, with the above sample definitions of the reflection coefficient and standing wave ratio, it is noted that these input characteristics are defined primarily by the input impedance of the device under test.

In reviewing technology pertaining to prior apparatus or method, it is recognized that prior technology does not teach the determining of input impedance of a device under test from power-related measurements made by the device under test itself. Similarly, no prior apparatus or method teaches the determining of other input characteristics—such as the reflection coefficient or standing wave ratio—from power-related measurements made by the device under test.

In order to determine the input impedance, reflection coefficient, or standing wave ratio of a device under test (apparently even those which make power-related measurements), prior technology has required separate measuring circuits to evaluate the input characteristics of the device under test.

Moreover, in prior techniques, the use of vector voltmeters, phase determining devices, and the like were employed when input characteristic determinations were sought.

SUMMARY OF THE INVENTION

The present invention provides unique apparatus and method for determining an impedance-dependent input characteristic of a device under test based on electrical measurements made by the device under test. The device under test is included in a specified network and the electrical measurements are made when the network is in each of several different, selectable configurations.

Preferably, a source of constant (or known) power is split to direct power into either of two legs where (a) one leg includes a first fixed impedance with a variable impedance in series therewith and (b) the other leg includes a second fixed impedance with the device under test in series therewith. Separate amplitude measurements are made by the device under test when the variable impedance is selectively (a) an open circuit, (b) a closed circuit, and (c) an impedance matched to the first fixed impedance. Three separate amplitude measurements—each with the variable impedance in a different condition—are combined to define the amplitude and phase of an input characteristic of the device under test.

It is thus an object of the invention to determine a sought input characteristic (in vector form) of the device under test from three amplitude measurements made by the device under test, thereby obviating the need for a vector voltmeter, phase determining device, or the like. This object is achieved by realizing that three amplitude measurements of the same power-related variable, made by the device under test with the variable impedance in each of its three respective conditions, add vectorially to equal zero at least substantially. By combining the three measurements as connected vector quantities, a triangle is formed from which phase angles can be determined.

In a first embodiment, a Thevenin source is connected across two terminals. Also connected across the terminals is (a) a first leg having a first fixed impedance in series with a variable impedance which is selectively an open circuit, a short circuit, or an impedance matched with the first fixed impedance and (b) a second leg having a second fixed impedance in series with the device under test. The two legs are in parallel and represent a bridge without any additional detector or meter. By making a measurement of current through the device under test when the variable impedance is in each of its three conditions, three amplitude measurements result which can be processed with other known quantities to yield a value for the impedance of the device under test.

A further object of the invention relates to the determining of a particular input characteristic for a given device under test. In an elemental network the input impedance is preferably determined whereas the reflection coefficient is preferably determined in a system based on scattering parameters. In any case, the input characteristic represents response to the application of power to the device under test.

DESCRIPTION OF THE INVENTION

A. Elemental Network Description

Figure 1:
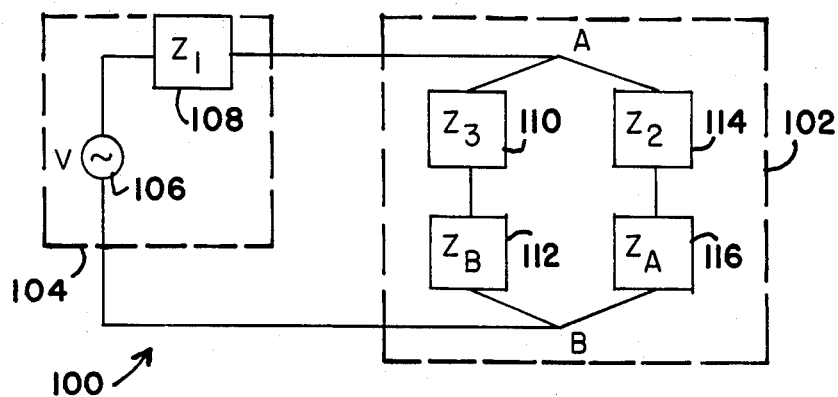
FIG. 1 is an illustration of the invention depicted in elemental network firm.

In FIG. 1, an elemental network 100 is shown in accordance with a preferred embodiment of the invention. The network 100 includes a bridge circuit 102 extending between two terminals A and B. Also connected across the terminals A and B is a constant output source 104. Specifically, an "ideal" voltage generator 106 (with a zero impedance) in series with all or part of an impedance 108 (Z1) represents a levelled source (104) in Thevenin form.

The output of the source 104 is split between two legs of the bridge circuit 102. The first leg includes a first fixed impedance 110 (Z3) and a selectably variable impedance 112 (ZB). The second leg includes a second fixed impedance 114 (Z2) and a device under test 116 having an impedance ZA.

The variable impedance 112 (ZB) can be selectably changed between a short circuit state, an open circuit state, or a matched impedance state in which ZB=Z3. The device under test 116 is a device which measures the amplitude of the current flowing through the device under test 116. Alternatively, however, the device under test 116 may be designed to measure the voltage amplitude across or the magnitude of power dissipated in the device under test 116. Regardless of which power-related variable (i.e. voltage, current, or power) is measured by the device under test 116, an input characteristic of the device under test 116 can be determined from amplitude measurements made when the impedance 112 (ZB) is in (a) an open circuit state, (b) a short circuit state, or (c) a matched impedance state. That is, an input characteristic relating to the response of the device under test 116 when power is applied thereto can be determined. Specifically, the input impedance ZA, the reflection coefficient p, or the standing wave ratio (for power or voltage or the like) at the input to the device under test 116 can be determined from three amplitude measurements (of the same power-related variable) with the impedance 112(ZB) being in one selected state after another.

Any of the above-noted input characteristics are determinable because the three amplitude measurements when added together as vector amplitudes are, at least to a good approximation, equal to zero. Hence, phase angles are readily determinable as well as the amplitudes of the input impedance, reflection coefficient, or standing wave ratio.

Referring again to FIG. 1, the current I through the impedance ZA of the device under test 116 is measured. When the impedance 112 (ZB) is an open circuit, I and $I_o$; when the impedance 112 (ZB) is a short circuit, I is $I_S$; and when the impedance 112 (ZB) is a matched impedance, I is $I_T$.

Analysis of the circuit in FIG. 1 indicates that:

$$V/I = Z_1 + Z_2 + Z_A + Z_1 \frac{Z_2 + Z_A}{Z_3 + Z_B} \quad (1)$$

If $Z_B = 0$ (short circuit), $I = I_S$ and $$V/I_S = Z_1 + Z_2 + Z_A + Z_1 \frac{Z_2 + Z_A}{Z_3} \quad (2)$$

$Z_B = \infty$ (open circuit), $I = I_0$ and $V/I_0 = Z_1 + Z_2 + Z_A$ (3)

If $Z_B = Z_3$ (matched), $I = I_T$ and (4)

$$V/I_T = Z_1 + Z_2 + Z_A + Z_1 \frac{Z_2 + Z_A}{2Z_3}$$

Figure 2:
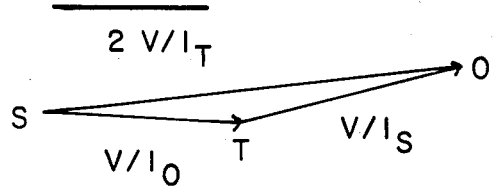
FIG. 2 is a phase diagram relating to the FIG. 1 illustration.

Recognizing also that:

$$V/I_S + V/I_0 - 2V/I_T = 0 \quad (5)$$

or the three vector quantities form a closed triangle, the law of cosines may be applied to determine the phase angles between $V/I_S$, $V/I_0$ and $2V/I_T$ pairs. This is illustrated in FIG. 2.

Letting the phase angle of $V/I_0$ represent a zero reference, the phase angle of $V/I_S = 180° - T$ where T represents one angle of triangle and is determined by the expression:

$$\cos T = (|1/I_S|^2 + |1/I_0|^2 - |2/I_T|^2)\left(\frac{|I_S I_0|}{2}\right) \quad (6)$$

The phase angle of $2V/I_T = S$ where $$\cos S = (|1/I_0|^2 + |2/I_T|^2 - |1/I_S|^2)\left(\frac{|I_0 I_T|}{4}\right) \quad (7)$$

$I_0$, $I_S$, and $I_T$ are of course known from the measurements made by the device under test 116.

If $Z_1$, $Z_2$ and $Z_3$ are known, $Z_A$ may be calculated as follows:

$$Z_A = \left[(Z_1 + Z_2)(1 - I_0/I_S) + \frac{Z_1 Z_2}{Z_3}\right] / \left[\frac{I_0}{I_S} - \frac{Z_1}{Z_3} - 1\right] \quad (8)$$

or $$Z_A = \left[(Z_1 + Z_2)\left(1 - \frac{I_0}{I_T}\right) + \frac{Z_1 Z_2}{2Z_3}\right] / \left[\frac{I_0}{I_T} - \frac{Z_1}{2Z_3} - 1\right] \quad (9)$$

In the particular case where $Z_1 = Z_2 = Z_3 = Z_0$ as would be the case where $Z_2$ and $Z_3$ are the elements of a power splitter and $Z_1$ the source impedance of a generator matched to the characteristic impedance $Z_0$.

$$Z_A = \frac{Z_0\left(2\frac{I_0}{I_S} - 3\right)}{\left(2 - \frac{I_0}{I_S}\right)} \quad (10)$$

or $$Z_A = \frac{Z_0\left(2\frac{I_0}{I_T} - \frac{5}{2}\right)}{\left(\frac{3}{2} - \frac{I_0}{I_T}\right)} \quad (11)$$

The phase angle of $I_0/I_S$ is $180° - T$ from equation (6) and the phase angle of $I_0/I_T$ is S from equation (7).

Similar calculations may also be generated were voltage or power measurements used to determine ZA.

B. Scattering Parameter Description

An alternative manner of viewing the present invention is by considering conventional scattering parameters for a three-port system 200 having a constant amplitude, $a_1$, wave incident upon a first port 202 with a load $\Gamma_A$ at the second port 204 and with a load $\Gamma_B$ at the third port 206. Power into the system from each respective port i (where i=1, 2, 3,) is identified as $a_i$; power passing out from each port being represented by $b_i$.

Figure 3:
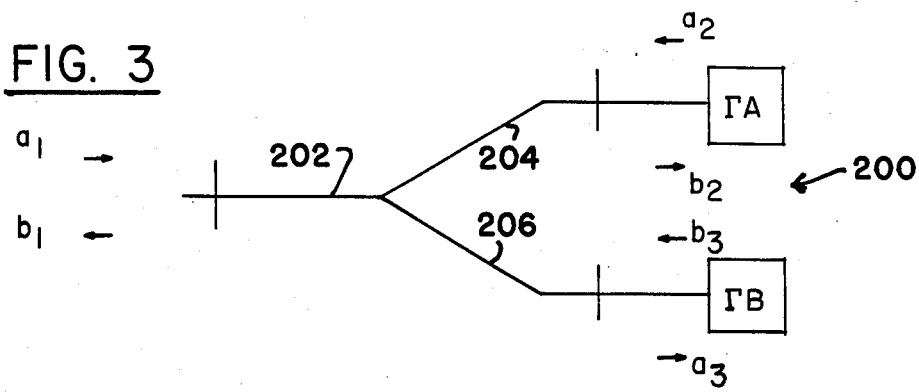
FIG. 3 is an illustration of the invention depicted in scattering parameter form.

In FIG. 3, the port 206 is adapted to have a selected state; either a short circuit, an open circuit, or a matched impedance state in which $\Gamma_B=0$. At port 204 is the device under test which measures, in this embodiment, power at port 204. Specifically, an expression $(s_{21}a_1/b_A)$ where $b_A$ is the power entering the port 204 from the system is determined for each state of port 206 as set forth below.

According to standard scattering parameter representation:

$$b_2 = s_{21}a_1 + s_{22}b_2\Gamma_A + s_{23}b_3\Gamma_B \quad (12)$$

$$b_3 = s_{31}a_1 + s_{32}b_2\Gamma_A + s_{33}b_3\Gamma_B \quad (13)$$

Equations (12) and (13) may be combined eliminating $b_3$ which here is not determined so $$\frac{s_{21}a_1}{b_A} = \frac{(1 - s_{22}\Gamma_A)(1 - s_{33}\Gamma_B) - s_{32}s_{23}\Gamma_A\Gamma_B}{1 - \left(s_{33} - s_{23}\frac{s_{21}}{s_{31}}\right)\Gamma_B} \quad (14)$$

where $b_A$ represents the power from the system into port 204. If a short circuit is attached to port 206, $\gamma_B = -1$, $b_A = b_S$ and $$\frac{s_{21}a_1}{b_S} = \frac{1 - s_{22}\Gamma_A + s_{33} - s_{22}s_{33}\Gamma_A + s_{32}s_{23}\Gamma_A}{1 + \left(s_{33} - s_{23}\frac{s_{21}}{s_{31}}\right)} \quad (15)$$

If an open circuit is attached at port 206, $\Gamma_B = +1$, $b_A = b_0$ and $$\frac{s_{21}a_1}{b_0} = \frac{1 - s_{22}\Gamma_A - s_{33} + s_{22}s_{33}\Gamma_A - s_{32}s_{23}\Gamma_A}{1 - \left(s_{33} - s_{23}\frac{s_{21}}{s_{31}}\right)} \quad (16)$$

If a matched termination is attached at port 206, $\Gamma_B=0$, $b_A = b_T$ and $$\frac{s_{21}a_1}{b_T} = 1 - s_{22}\Gamma_A \quad (17)$$

Now, if the general three-port is a good symmetrical power splitter $$s_{21} \approx s_{31} \approx \tfrac{1}{2}\angle\phi \text{ and } s_{33} \approx s_{23} \approx \tfrac{1}{4}\angle\phi$$

Figure 4:
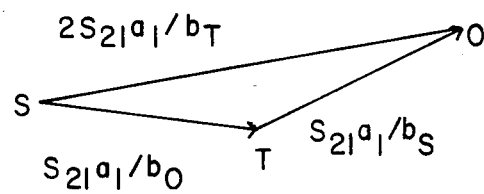
FIG. 4 is a phase diagram relating to the FIG. 3 illustration.

(where $\phi$ and $\theta$ are phase angle magnitudes), then to a good approximation $$s_{21}a_1/b_S + s_{21}a_1/b_0 - 2s_{21}a_1/b_T = 0$$

or the three vector quantities form a closed triangle as in FIG. 4. The law of cosines may be applied to determine the phase angles between $s_{21}a_1/b_{A'}$, $s_{21}a_1/b_S$, and $s_{21}a_1/b_T$ pairs. By letting the phase angle of $s_{21}a_1/b_0=0$ as a reference, the phase angle of $s_{21}a_1/b_S = 180° - T$ where $$\cos T = (|1/b_S|^2 + |1/b_0|^2 - |2/b_T|^2)\left(\frac{|b_S b_0|}{2}\right) \quad (19)$$

and the phase angle of $s_{21}a_1/b_0 = S$ where $$\cos S = (|1/b_0|^2 + |2/b_T|^2 - |1/b_S|^2)\left(\frac{|b_0 b_T|}{2}\right) \quad (20)$$

Because $s_{22}$, $s_{23}$, and $s_{33}$ of the power splitter are known, $\Gamma_A$ may be calculated.

To a first approximation for an ideal power splitter $S_{31} = S_{21} = \tfrac{1}{2}$ and $s_{33} = s_{23} = s_{22} = \tfrac{1}{4}$ then equations (15), (16), and (17) become $$a_1/2b_S = 5/4 - \Gamma_A/4 \quad (21)$$

$$a_1/2b_0 = \tfrac{3}{4} - \Gamma_A/4 \quad (22)$$

and $a_1/2b_T = 1 - \Gamma_A/4 \quad (23)$ so $\Gamma_A = 5 - 3b_0/b_S/1 - b_0/b_S \quad (24)$ or $\Gamma_A = 4 - 3b_0/b_T/1 - b_0/b_T \quad (25)$ A more nearly accurate value may be obtained by substituting measured values of $s_{22}$, $s_{33}$, $s_{32}$ and $s_{23}$ for the power splitter into equations (15), (16), (17), (19) and (20) then $$\frac{b_0}{b_S} = \frac{[1 + S_{33} - (S_{22} + S_{22}S_{33} - S_{32}S_{23})\Gamma_A][1 - S_{33} + S_{23}S_{21}/S_{31}]}{[1 - S_{33} - (S_{22} - S_{22}S_{33} + S_{32}S_{23})\Gamma_A][1 + S_{33} - S_{23}S_{21}/S_{31}]} \quad (26)$$

and $$\frac{b_0}{b_T} = \frac{(1 - S_{22}\Gamma_A)(1 - S_{33} + S_{23}S_{21}/S_{31})}{[1 - S_{33} - (S_{22} - S_{22}S_{33} + S_{32}S_{23})\Gamma_A]} \quad (27)$$

where the phase angle of $b_0/b_S$ is 180°−T from equation (19) and the phase angle of $b_0/b_T$ is S from equation (20). The equations (26) and (27) may then be solved for $\Gamma_A$, the reflection coefficient of the device under test.

C. Specific Embodiments

Figure 5:
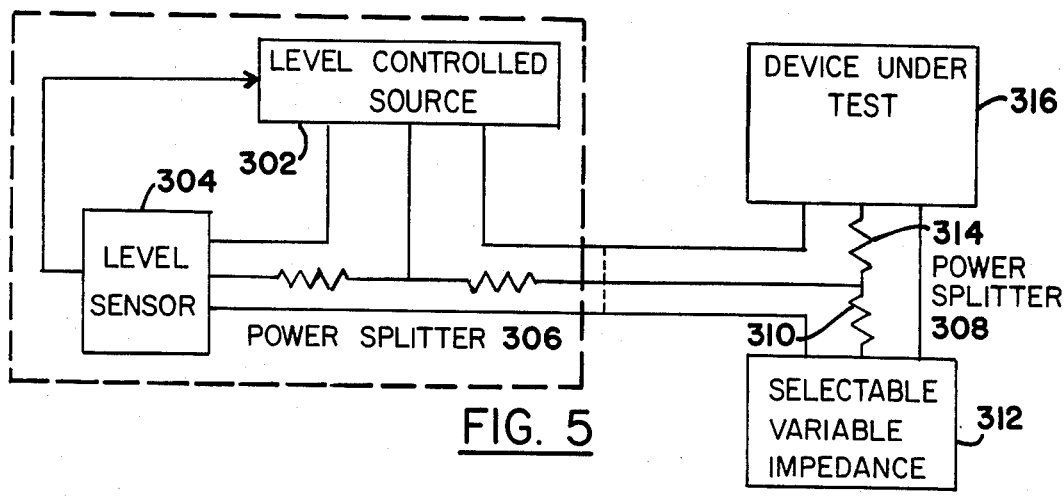
FIGS. 5, 6, and 7 are illustrations of specific embodiments of equipment implementing the invention.
Figure 6:
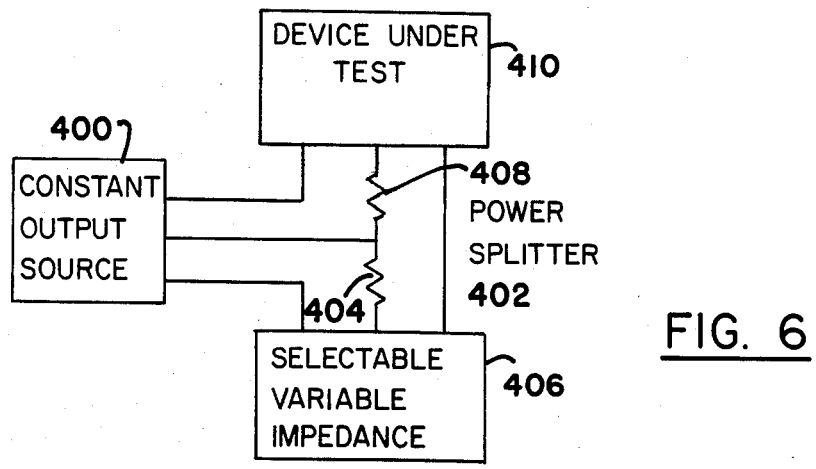
Figure 7:
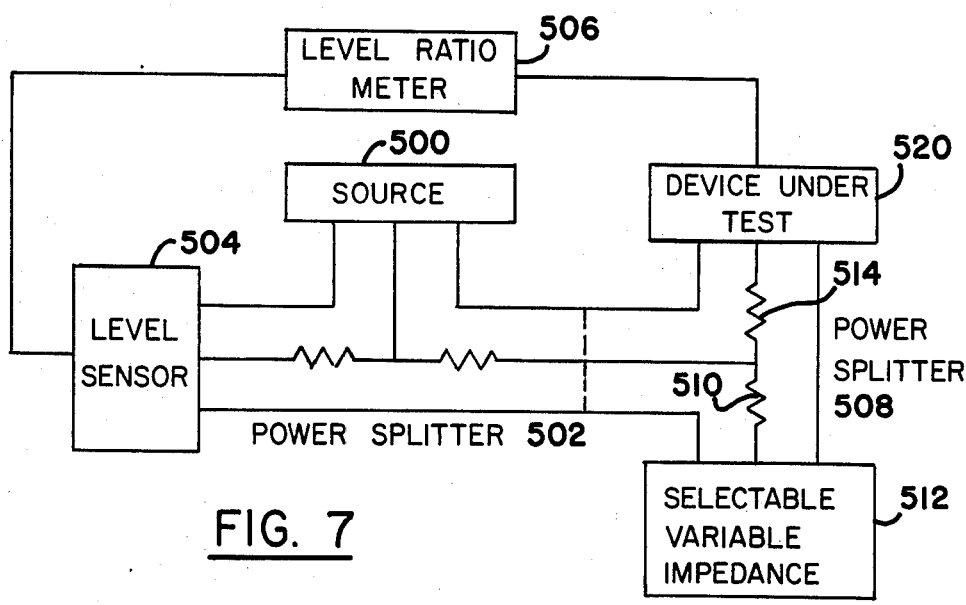

FIGS. 5 through 7 depict three actual configurations of equipment wherein the invention may be practiced.

In FIG. 5, a source of constant power 300 is provided by a level-controlled source 302, the output from which is adjusted by input from a sensor 304. The output from the level-controlled source 302 passes through a splitter 306 providing a first portion of power to the sensor 304 with a second portion being directed to a second splitter 308. Power along one leg of the second splitter 308 passes through a fixed impedance 310 enroute to a selectable variable impedance 312 which can be either an open circuit, a short circuit, or a matched impedance. Power travelling along the other leg of the second splitter 308 passes through a fixed impedance 314 enroute to a device under test 316.

FIG. 6 shows a constant output source 400 directing power through a splitter 402. Power along one leg of the splitter 402 passes thorugh a fixed impedance 404 enroute to a selectable variable impedance 406 (as in FIG. 5) and power along the other leg passes through a fixed impedance 408 enroute to a device under test 410.

FIG. 7 shows a source 500 directing its output through a splitter 502. One leg of the splitter 502 is coupled to a level sensor 504 output from which enters a level ratio meter 506. The sensor 504 and meter 506 fix the output of the source 500 to be a known, thereby rendering it analogous to a constant source in that both reduce the number of unknown factors in the circuit.

The other leg of the splitter 502 directs power to a second splitter 508 which splits power between two legs. One leg includes a fixed impedance 510 in series with a selectable variable impedance 512 (as in FIG. 5). The second leg includes a fixed impedance 514 in series with a device under test 520.

The devices under test in FIGS. 5, 6, and 7 each measure a power-related amplitude such as voltage, current, or power thereat. Typical devices under test may include any of various alternative configurations including: (a) a power indicator and power sensor; (b) a power sensor or mixer together with an alternator; (c) a power sensor or mixer together with a two-port network; or (d) other similar arrangements.

Other improvements, modifications and embodiments will become apparent to one of ordinary skill in the art upon review of this disclosure. Such improvements, modifications and embodiments are considered to be within the scope of this invention as defined by the following claims.

I claim:

1. Apparatus for evaluating the impedance of a device under test, where the device under test measures a variable electrical component of power applied thereto; the apparatus comprising:
   a known source having internal impedance;
   two circuit legs connected in parallel to said known source;
   one leg having, in series, a first fixed impedance (Z3) and a selectable impedance (ZB) which can be either (a) a short circuit, (b) an open circuit, or (c) an impedance matched to the first fixed impedance and the other leg having, in series, a second fixed impedance (Z2) and the impedance of the device under test (ZA); and
   means for determining the impedance of the device under test (ZA) from amplitude measurements made by the device under test;
   said means including means for selecting the value of said selectable impedance to be a short circuit, an open circuit, and
   the value of said first fixed impedance.

2. Apparatus for measuring the input impedance of a device under test wherein the device under test is adapted to measure power applied thereto, the apparatus comprising:
   a source of constant power;
   a circuit which extends between two terminals (A, B); includes a first fixed impedance and a variable impedance in series across the terminals (A) and (B); and further includes a second fixed impedance and the device under test in series across the terminals (A) and (B); and
   means for selectively changing the variable impedance to be either (a) a short circuit, (b) an open circuit or (c) a matched impedance element which is equal to said first fixed impedance;
   the device under test measuring power applied thereto when the variable impedance is (a) a short circuit, (b) an open circuit, and (c) a matched impedance, respectively; the device under test making three measurements one for each of the three states of the variable impedance and
   means for combining separate measurements made by the device under test when each of all three different terminations is selectively attached to the second port, the separate measurements being combined to yield a value of said input characteristic of the device under test.

3. Apparatus as in claim 2 wherein the device under test comprises:
   a two port element and power sensor means for measuring power therefrom.

4. Apparatus as in claim 3 wherein the source is a constant source of voltage V having an internal impedance (Z1); and wherein the variable measured by the device under test is electrical current; the device under test measuring (a) a short circuit current ($I_s$) when the selectable impedance is said short circuit, (b) an open circuit current ($I_o$) when the selectable impedance is said open circuit, and (c) a termination current ($I_T$) when the selectable impedance is said matched impedance.

5. Apparatus as in claim 4 wherein the impedance determining means comprises:
   means for defining the three amplitude measurements vectorially according to the equation:

$$V/I_S + V/I_O - 2V/I_T = 0.$$

6. Apparatus as in claim 5 wherein the impedance determining means further comprises:
   means for combining the equivalent impedance (Z1), the fixed impedances (Z2) and (Z3), and the values of the currents $I_o$ and $I_s$ measured by the device under test to determine ZA; and wherein the combining means includes:
   means for defining ZA as:

$$Z_A = \left[ (Z_1 + Z_2)\left(1 - \frac{I_0}{I_T}\right) + \frac{Z_1 Z_2}{2Z_3} \right] / \left[ \frac{I_0}{I_T} - \frac{Z_1}{2Z_3} = 1 \right].$$

7. Apparatus as in claim 5 further comprising:
   means for defining an angle T according to the expression:

$$\cos T = (|1/I_S|^2 + |1/I_O|^2 - |2/I_T|^2)\left(\frac{|I_S I_0|}{2}\right)$$

where the angle T is the angle between the vector $V/I_o$ and the vector $V/I_s$.

8. Apparatus as in claim 5 wherein the impedance determining means further comprises:
   means for combining the internal impedance (Z1), the fixed impedances (Z2) and (Z3), and the values of the currents $I_o$ and $I_T$ measured by the device under test to determine ZA.

9. Apparatus as in claim 6 further comprising:
   means for defining an angle T according to the expression:

$$\cos T = (|1/I_S|^2 + |1/I_0|^2 - |2/I_T|^2)\left(\frac{|I_S I_0|}{2}\right)$$

where the angle T is the angle between the vector $V/I_o$ and the vector $V/I_s$.

10. Apparatus as in claim 9 further comprising:
means for defining an angle S according to the expression:

$$\cos S = (|1/I_0|^2 + |2/I_T|^2 - |1/I_S|^2)\left(\frac{|I_0 I_T|}{4}\right)$$

where the angle S is the angle between the vector $2V/I_T$ and the vector $V/I_o$.

11. Apparatus as in claim 5 wherein power from the source follows a path having a characteristic impedance (Z0) and wherein the impedances Z0, Z1, Z2, and Z3 are all equal;
the combining means including means for defining ZA as:

$$Z_A = \frac{Z_0\left(2\frac{I_0}{I_S} - 3\right)}{\left(2 - \frac{I_0}{I_S}\right)}$$

12. Apparatus as in claim 7 wherein power from the source follows a path having a characteristic impedance (Z0) and wherein the impedances Z0, Z1, Z2, and Z3 are all equal;
the combining means including means for defining ZA as:

$$Z_A = \frac{Z_0\left(2\frac{I_0}{I_S} - 3\right)}{\left(2 - \frac{I_0}{I_S}\right)}$$

13. Apparatus as in claim 7 wherein power from the source follows a path having a characteristic impedance (Z0) and wherein the impedances Z0, Z1, Z2, and Z3 are all equal;
the combining means including means for defining ZA as:

$$Z_A = \frac{Z_0\left(2\frac{I_0}{I_T} - \frac{5}{2}\right)}{\left(\frac{3}{2} - \frac{I_0}{I_T}\right)}$$

14. Apparatus for determining the value of an input characteristic of a device under test where (a) the input characteristic relates to the response of the device under test to the application of power thereto and (b) the device under test is adapted to measure at least one variable electrical component of power applied thereto;
the apparatus comprising:
a network having (a) three ports and (b) a symmetrical power splitter disposed between the three ports;
source means for providing a known electrical signal of known incident power to the first of said three ports; and
means for selectively attaching to a second of the three ports either (a) an open circuit termination, (b) a short circuit termination, or (c) a matched termination having a reflection coefficient of zero;
the device under test being positioned at a third of the three ports, the device under test measuring said at least one variable electrical component of the incident power when the second port has selectively attached thereto (a) the open circuit termination (b) the short circuit termination, or (c) the matched termination;
the apparatus further comprising:
means for combining separate measurements made by the device under test when each of all three different terminations is selectively attached to the second port, the separate measurements being combined to yield a value of said input characteristic of the device under test.

15. Apparatus as in claim 14 wherein the source means provides constant incident power amplitude $a_1$ to the first port; and
wherein the combining means includes:
means for determining the reflection coefficient vector of the device under test from separate power measurements made thereby when each of all three different terminations are selectively attached to the second port.

16. Apparatus as in claim 14 wherein the source means provides constant incident power amplitude $a_1$ to the first port; and
wherein the combining means includes:
means for determining at least the magnitude of the reflection coefficient vector of the device under test from separate power measurements made thereby when each of all three different terminations are selectively attached to the second port.

17. Apparatus as in claim 15 wherein the reflection coefficient determining means includes (a) means for defining the three port network in terms of (i) scattering parameters and (ii) incident power and reflected power at each port, and (b) means for selecting a variable which is defined at least in part by the incident power to the third port, and (c) means for measuring the selected variable once for each of all three terminations are attached to the second port.

18. Apparatus as in claim 17 wherein the reflection coefficient determining means further comprises:
means for vectorially combining the three measurements made by the means for measuring the selected variable.

19. Apparatus as in claim 8 wherein the combining means includes:
means fior defining ZA as:

$$Z_A = \left[(Z_1 + Z_2)(1 - I_0/I_S) + \frac{Z_1 Z_2}{Z_3}\right] / \left[\frac{I_0}{I_S} - \frac{Z_1}{Z_3} - 1\right]$$

20. Apparatus as in claim 19 further comprising:
means for defining an angle T according to the expression:

$$\cos T = (|1/I_S|^2 + |1/I_0|^2 - |2/I_T|^2)\left(\frac{|I_S I_0|}{2}\right)$$

where the angle T is the angle between the vector $V/I_o$ and the vector $V/I_s$.

21. Apparatus as in claim 2 wherein the device under test comprises:

an attenuator and power sensor means for measuring power from the attenuator.

22. Apparatus as in claim 2 wherein the device under test comprises:

a power indicator and power sensor means for measuring power therefrom.

23. A method of determining an input characteristic of a device under test having a power measuring device therein, wherein said input characteristic is defined by the input impedance of the device under test, the method comprising the steps of:

forming a circuit having (a) a first leg including a first fixed impedance and the device under test in series across the two terminals and (b) a second leg including a second fixed impedance and a variable impedance in series across the two terminals;

splitting power of a constant amplitude between the two legs;

selectively defining the state of the variable impedance as either (a) a short circuit, (b) an open circuit, or (c) an impedance which matches the first fixed impedance; and measuring the incident power to the device under test with the power measuring device thereof when the variable impedance is selected to be (a) a short circuit, (b) an open circuit, and (c) a matched impedance; and deriving a value for the input characteristic from three respective measurements of incident power to the device under test for each of the three selectable states of the variable impedance.

24. A method as in claim 23 wherein the step of deriving a value for the input characteristic includes the step of:

deriving a value for the input impedance to the device under test.

25. A method as in claim 23 wherein the step of deriving a value for the input characteristic includes the step of:

deriving a value for the standing wave ratio of the input to the device under test.

26. A method as in claim 23 wherein the step of deriving a value for the input characteristic includes the step of:

deriving a value for the reflection coefficient of the input to the device under test.

* * * * *